United States Patent
Zijlstra et al.

(10) Patent No.: US 7,763,951 B2
(45) Date of Patent: Jul. 27, 2010

(54) FUSE STRUCTURE FOR MAINTAINING PASSIVATION INTEGRITY

(75) Inventors: Piebe Anne Zijlstra, Middelaar (NL); Elizabeth Ann Killian, Santa Clara, CA (US)

(73) Assignee: NXP B.V., Eindhoven (NL)

( * ) Notice: Subject to any disclaimer, the term of this patent is extended or adjusted under 35 U.S.C. 154(b) by 494 days.

(21) Appl. No.: 10/572,225

(22) PCT Filed: Sep. 18, 2004

(86) PCT No.: PCT/IB2004/051792

§ 371 (c)(1),
(2), (4) Date: Aug. 22, 2008

(87) PCT Pub. No.: WO2005/029557

PCT Pub. Date: Mar. 31, 2005

(65) Prior Publication Data

US 2008/0296726 A1    Dec. 4, 2008

Related U.S. Application Data

(60) Provisional application No. 60/504,673, filed on Sep. 19, 2003.

(51) Int. Cl.
*H01L 21/768* (2006.01)
*H01L 23/525* (2006.01)

(52) U.S. Cl. .............. 257/529; 257/351; 257/E21.592; 257/E23.149; 438/601; 438/240

(58) Field of Classification Search ............... 257/529, 257/200, 351, E23.149, E21.592, 310; 438/601, 438/131, 240, 958
See application file for complete search history.

(56) References Cited

U.S. PATENT DOCUMENTS

| | | | | |
|---|---|---|---|---|
| 5,256,899 A | * | 10/1993 | Rangappan | 257/665 |
| 5,844,295 A | * | 12/1998 | Tsukude et al. | 257/529 |
| 5,895,257 A | | 4/1999 | Tsai et al. | |
| 6,100,116 A | | 8/2000 | Lee et al. | |
| 6,396,121 B1 | * | 5/2002 | Bertin et al. | 257/530 |
| 6,461,797 B1 | * | 10/2002 | Lercel et al. | 430/318 |
| 2002/0155672 A1 | | 10/2002 | Wang et al. | |
| 2003/0003703 A1 | * | 1/2003 | Barth et al. | 438/601 |
| 2003/0038339 A1 | * | 2/2003 | Mori | 257/530 |
| 2003/0139028 A1 | * | 7/2003 | Sun et al. | 438/601 |

OTHER PUBLICATIONS

Quirk, "Semiconductor manufacturing technology", 2001, Prentice-Hall, pp. 438-439.*

* cited by examiner

*Primary Examiner*—Thomas L Dickey
*Assistant Examiner*—Nikolay Yushin

(57) ABSTRACT

A fuse structure (106) includes a patterned conductor disposed over a passivation layer (302), which is disposed over a substrate (110), such as, for example, an inter-layer dielectric layer of an integrated circuit. A second passivation layer (112) is formed over the integrated circuit including over the fuse structure (106), and then patterned to open a window (108) through the second passivation layer (112) at a location over the fuse structure (106), with the window (108) fully landed by the underlying passivation layer (302). In various aspects of the present invention, the fuse (106) may be programmed either before or after the photoresist layer used in the patterning of the second passivation layer (112) is removed.

21 Claims, 5 Drawing Sheets

FUSE STRUCTURE FOR MAINTAINING PASSIVATION INTEGRITY

CROSS REFERENCE TO RELATED APPLICATION

This application claims the benefit of U.S. provisional application Ser. No. 60/504,673 filed Sep. 19, 2003, which is incorporated herein whole by reference.

The present invention relates generally to electrical circuit elements suitable for incorporation in integrated circuits, and more particularly relates to electrical fuse structures adapted to provide increased resistance to the penetration of environmental contaminants into the substrate regions underlying the fuse structure.

Semiconductor manufacturing processes are used to produce integrated circuits that include a variety of electrical circuit elements. Such circuit elements commonly include, for example, transistors, resistors, capacitors, and diodes. Typical semiconductor manufacturing processes are also capable of producing structures that can act as electrical fuses. Such fuses may be programmed, or "blown", by heating the fuse, typically by conducting a current through the fuse, or by illuminating, and thereby heating, the fuse with a laser beam.

One commonly used fuse structure includes a relatively narrow piece of metal, or other conductive material, disposed on a layer, typically an upper layer, of an integrated circuit, and further includes an opening in a generally overlying passivation layer. Such an opening, or window, in the passivation provides a path for material that is thrown off when the fuse is programmed, or blown.

As indicated above, the typical fuse programming process involves forming a window, or opening, in the passivation layer. Unfortunately, such openings in the passivation layer provide paths for contaminants in the environment to penetrate underlying layers of the integrated circuit and adversely affect the performance and/or reliability thereof.

What is needed are structures and methods for maintaining an acceptable level of product reliability while still providing a fuse programming window.

Briefly, a fuse structure includes a patterned conductor disposed over a passivation layer, which is disposed over a substrate, such as, for example, an inter-layer dielectric layer of an integrated circuit. A second passivation layer is formed over the integrated circuit including over the fuse structure, and then patterned to open a window through the second passivation layer at a location over the fuse structure, with the window fully landed by the underlying passivation layer.

In various aspects of the present invention, the fuse may be programmed either before or after the photoresist layer used in the patterning of the second passivation layer is removed.

Figure 1:
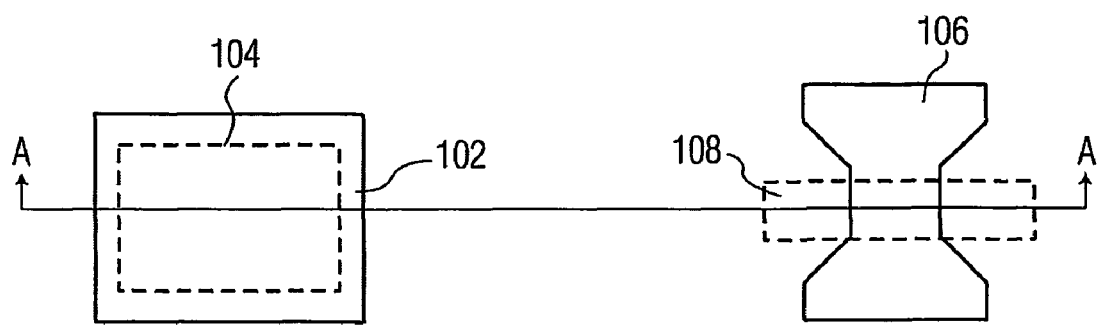
FIG. 1 is a top view of a conventional layout for a portion of an integrated circuit showing pad metal and a fuse structure along with openings aligned with the pad metal and fuse structure, in an overlying passivation layer.

Generally, the present invention relates to improved reliability for integrated circuits that include fuses. Various embodiments of the present invention include additional passivation material disposed under the fuse, that is, disposed between the fuse and the substrate underlying the fuse.

Some embodiments of the present invention include a blanket passivation layer upon which the fuse structure is fabricated. Such a blanket layer may be a silicon nitride layer formed by way of any suitable process such as well known PECVD silicon nitride deposition operation. Such a deposition would typically be performed subsequent to the planarization of the underlying ILD layer.

In an alternative embodiment of the present invention, the blanket layer of passivation material may be patterned so as to leave blocks, or regions, of passivation material in those areas where a fuse structure is intended to be formed, wherein those blocks are larger than the fuse windows that will be opened in an overlying topside passivation layer. Such blocks of passivation material, as opposed to a blanket layer, require the additional process complexity of masking and etching (i.e., patterning), but may provide some electrical advantages. Such electrical advantages include reduced parasitic capacitance. Parasitic capacitance is associated with undesirable electrical effects such as increased cross-talk, and increased power consumption. Since a passivation material such as silicon nitride has a higher dielectric constant than commonly used ILD materials, such as for example, oxides of silicon, fluorine doped oxides of silicon, or low-k materials generally, disposing higher dielectric constant passivation material at a lower level than the topside passivation level will impact the parasitic capacitance between various interconnect paths of the integrated circuit. Therefore, it may be desirable in alternative embodiments to reduce, to the extent practical, the presence of the high dielectric constant passivation material, that is disposed between the fuse and the underlying portions of the integrated circuit. In this way, parasitic capacitance between various signal lines of the integrated circuit are impacted to a generally negligible degree. It is noted that forming such passivation blocks results in a non-planar surface and this is discussed in greater detail below.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

IC is an acronym for integrated circuit.

ILD is an acronym for inter-layer dielectric.

CVD is an acronym for chemical vapor deposition.

PECVD is an acronym for plasma enhanced chemical vapor deposition.

Bonding pads are typically formed from metal disposed on an uppermost interconnect level. Bonding pads provide signal and power paths between the circuit elements of an integrated circuit and external devices. Bonding pads may be referred to input terminals, output terminals, or input/output terminals depending upon the circuitry to which they are connected. Bonding pads may be referred to in a general sense as connection terminals.

Low-k material refers to materials that have a dielectric constant that is less than the dielectric constant of silicon dioxide.

Referring to FIG. 1, a top view of a conventional layout for a portion of an integrated circuit including pad metal and a fuse structure along with openings in an overlying passivation layer that are aligned with the pad metal and fuse structure, is shown. Polygons 102 and 106 represent patterned conductors on a common interconnect level. In this illustrative embodiment, polygon 102 represents a bonding pad, and polygon 106 represents a fuse structure. Polygons 104 and 108 represent openings in a passivation layer. It is noted that polygon 102 (pad) overlaps polygon 104 (window), indicating that the opening in the passivation layer associated with polygon 104 lands on the metal pad associated with polygon 102. However, polygon 108 (window) overlaps polygon 106 (fuse structure), indicating that the opening in the passivation layer associated with polygon 108 does not land completely on the metal of the fuse structure, but rather also exposes an underlying substrate.

Figure 2:
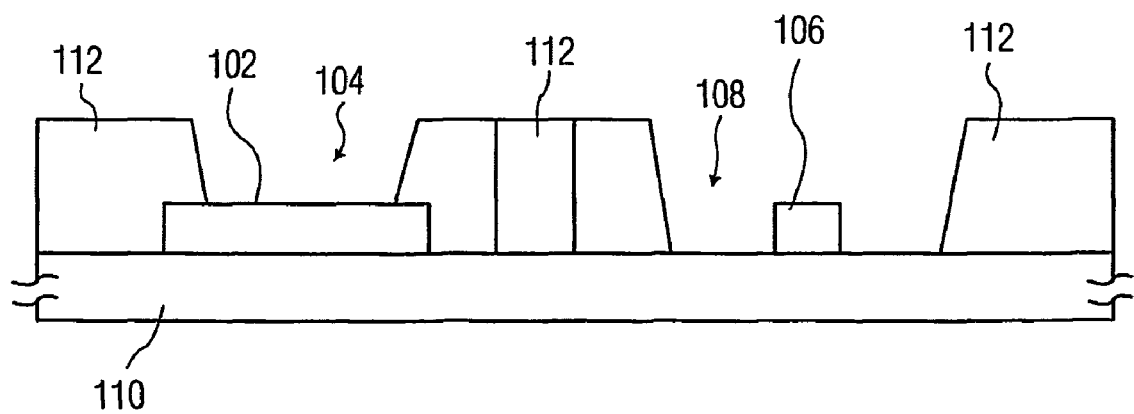
FIG. 2 is a cross-sectional view of a portion of the integrated circuit taken along the line A-A of FIG. 1.

FIG. 2 is a cross-sectional view of a portion of an integrated circuit, formed in accordance with the layout of FIG. 1, taken along the line A-A of FIG. 1. More particularly, it can be seen that pad 102 and fuse structure 106 are disposed over a substrate 110. Typically, substrate 110 has an electrically insulating surface, and includes one or more other levels thereunder in which various interconnections and electrical circuit elements are disposed. Such structures are well known in the field and are not described further herein. A passivation layer 112 is disposed over substrate 110. As can be seen in FIG. 2, passivation layer 112 is patterned such that openings 104 and 108 have been formed therein. Opening 104 is fully "landed", that is, opening 104 is completely surrounded by pad 102. By having opening 104 reach only to pad 102, rather than to substrate 110, contaminants are prevented from reaching substrate 110 through opening 104. However, opening 108 is not fully landed, that is, opening 108 exposes both fuse structure 106 and substrate 110. Substrate 110 is susceptible to the introduction of contaminants through opening 108 because there is no intervening blocking layer between opening 108 and substrate 110. There are a variety of contaminants, well known in this field, that can cause reliability degradation subsequent to reaching substrate 110. Examples of such contaminants are sodium, and water.

Figure 3:
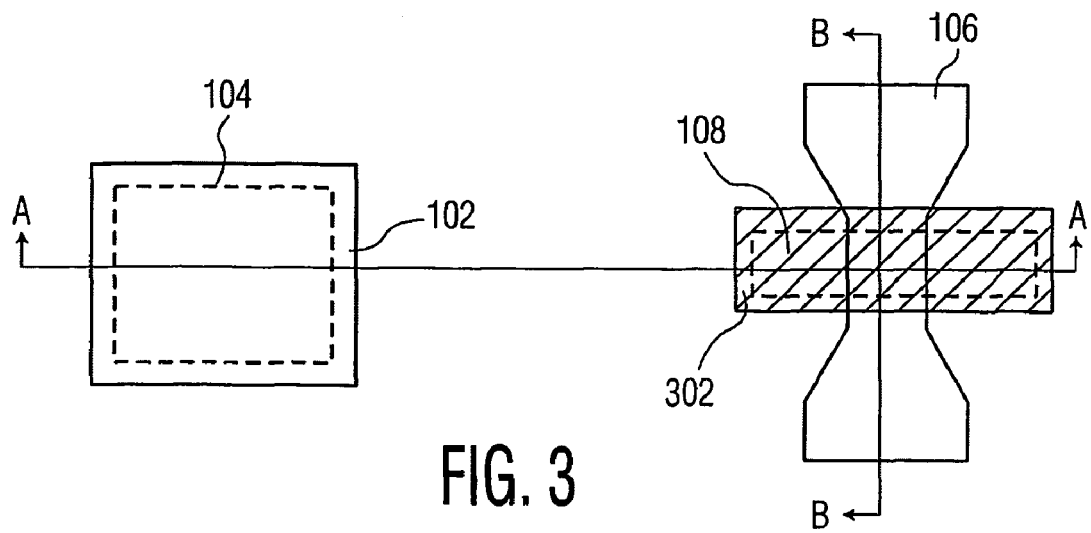
FIG. 3 is a top view of a layout, in accordance with the present invention, for a portion of an integrated circuit showing pad metal, a fuse structure and a lower passivation block, along with openings aligned with the pad metal and fuse structure, in an overlying passivation layer.

FIG. 3 is a top view of a layout of an illustrative example in accordance with the present invention, for a portion of an integrated circuit showing pad metal, a fuse structure and a lower passivation block, along with openings in an overlying passivation layer that are aligned with the pad metal and fuse structure. Several features of FIG. 3 are similar to those found in FIG. 1. More particularly, polygons 102 and 106 represent patterned conductors on a common interconnect level. In this illustrative embodiment, polygon 102 represents a bonding pad, and polygon 106 represents a fuse structure. Polygons 104 and 108 represent openings in the passivation layer. FIG. 3 also shows polygon 302 which represents a passivation block, or region, disposed between fuse structure 106 and substrate 110. As mentioned above, the passivation material disposed between fuse 106 and substrate 110 may be patterned, as in this example, or, in other embodiments, may be in the form of a blanket layer.

As can be seen in FIG. 3, polygon 102 (pad) overlaps polygon 104 (window), indicating that the opening in the passivation layer associated with polygon 104 lands on the metal pad associated with polygon 102. In accordance with the present invention, polygon 302 (passivation block) overlaps polygon 108 (window); and polygon 108 (window) overlaps polygon 106 (fuse structure), indicating that although the opening in the passivation layer associated with polygon 108 does not land completely on the metal of the fuse structure, passivation block 302 provides a means for preventing the reliability degradation associated with conventional fuse windows by blocking the pathway through which contaminants would otherwise enter the substrate.

Figure 4:
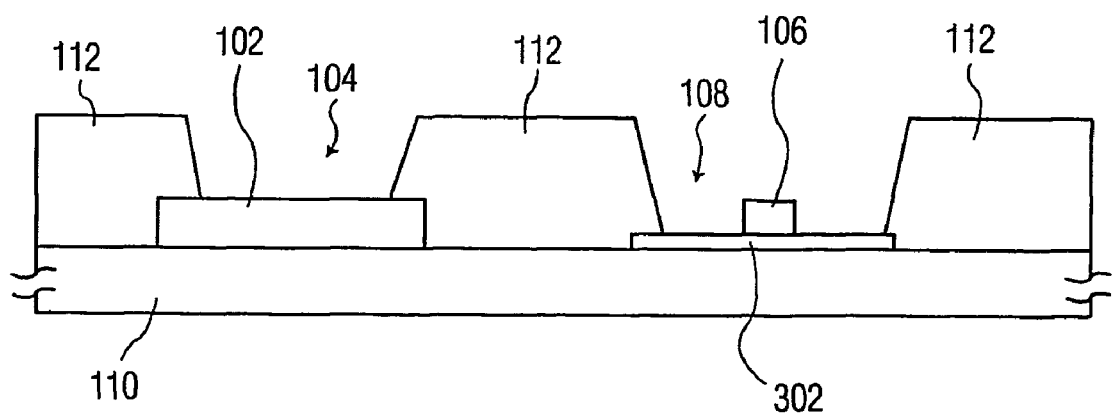
FIG. 4 is a cross-sectional view of a portion of the integrated circuit taken along the line A-A of FIG. 3.

FIG. 4 is a cross-sectional view of a portion of an integrated circuit, formed in accordance with the layout of FIG. 3, taken along the line A-A of FIG. 3. It can be seen that pad 102 and fuse structure 106 are disposed over a substrate 110. Typically, substrate 110 has an electrically insulating surface, and includes one or more other levels thereunder in which various interconnections and electrical circuit elements are disposed. A passivation layer 112 is disposed over substrate 110. As can be seen in FIG. 4, passivation layer 112 is patterned such that openings 104 and 108 have been formed therein. Opening 104 is fully "landed", that is, opening 104 is completely surrounded by pad 102. By having opening 104 reach only to pad 102, rather than to substrate 110, contaminants are prevented from reaching substrate 110 through opening 104. Opening 108 is not fully landed by fuse structure 106, but, in accordance with the present invention, opening 108 is fully landed by the combination of fuse structure 106 and passivation block 302. Substrate 110 is no longer susceptible to the introduction of contaminants through opening 108 as shown in prior art FIGS. 1 and 2, because, in accordance with the present invention, there is an intervening blocking layer (i.e., passivation block 302) between opening 108 and substrate 110.

Passivation block, or region, 302 may be formed from the same material or materials that comprise the topside, or uppermost, passivation structure. Topside passivation layers are known and used in this field to prevent contamination of, and/or damage to, the underlying layers of an integrated circuit.

Figure 5:
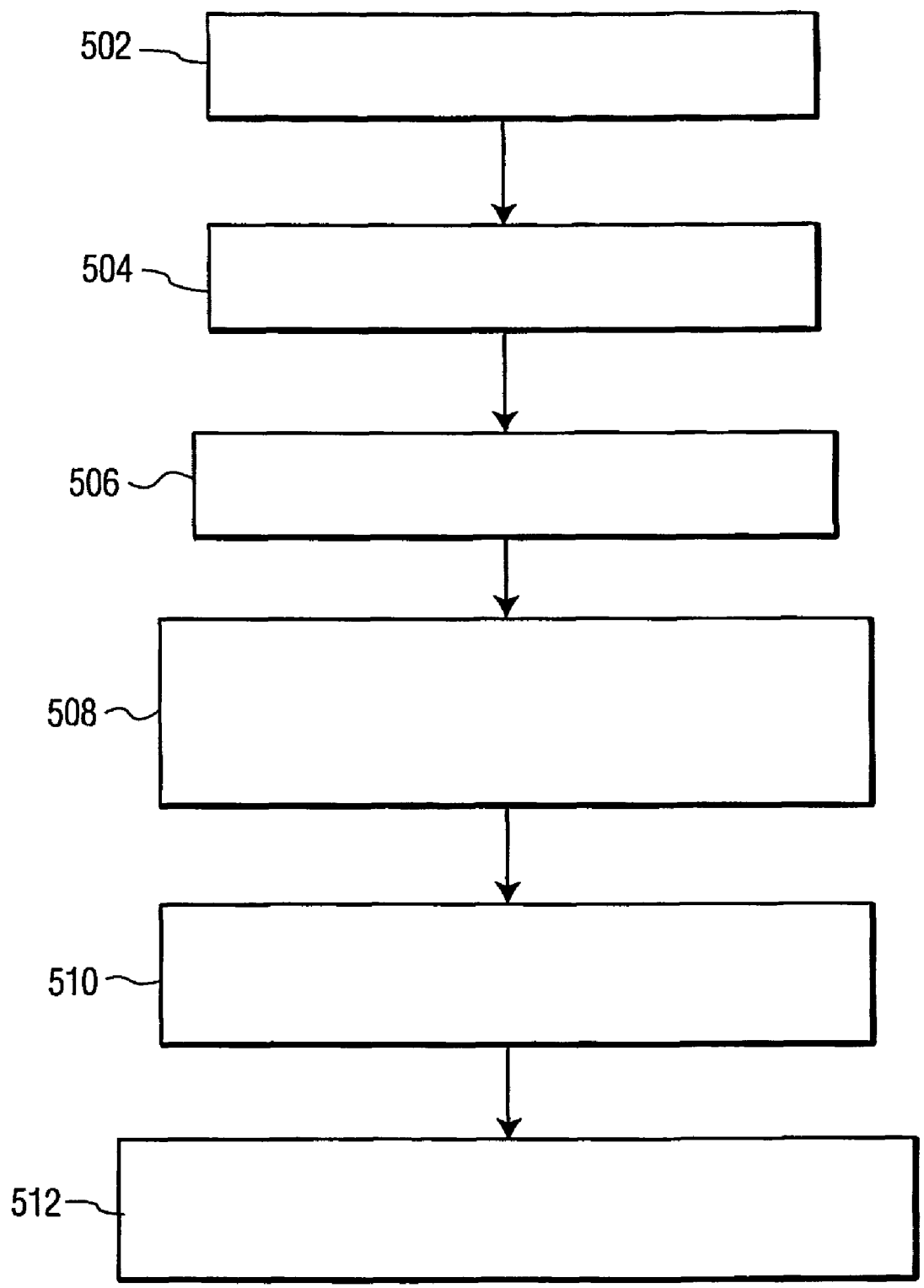
FIG. 5 is a flow diagram of an illustrative process in accordance with the present invention.

FIG. 5 shows a flow diagram of an illustrative process in accordance with the present invention. This illustrative process includes providing 502 a substrate with an electrically insulating surface, and forming 504 a first passivation layer over the surface of the substrate. In this illustrative embodiment the substrate comprises the lower layers of a wafer, or partially fabricated integrated circuit, and the electrically insulating surface is typically the uppermost ILD of an integrated circuit. The passivation layer is typically a material suitable for protecting the underlying layers from the introduction of contaminants, including, but not limited to, sodium, and water. Silicon nitride may be used as the material of the passivation layer. Formation of such a silicon nitride passivation layer is typically done by way of a plasma enhanced chemical vapor deposition process. Such PECVD operations for the formation of silicon nitride layers are well known in this field are not described in greater detail herein.

In alternative embodiments of the present invention, the first passivation layer may comprise a multi-layer structure, such as, for example, a thin oxide layer on top of silicon nitride layer. The present invention is not limited to the use of a single layer of silicon nitride as the first passivation layer.

Figure 6:
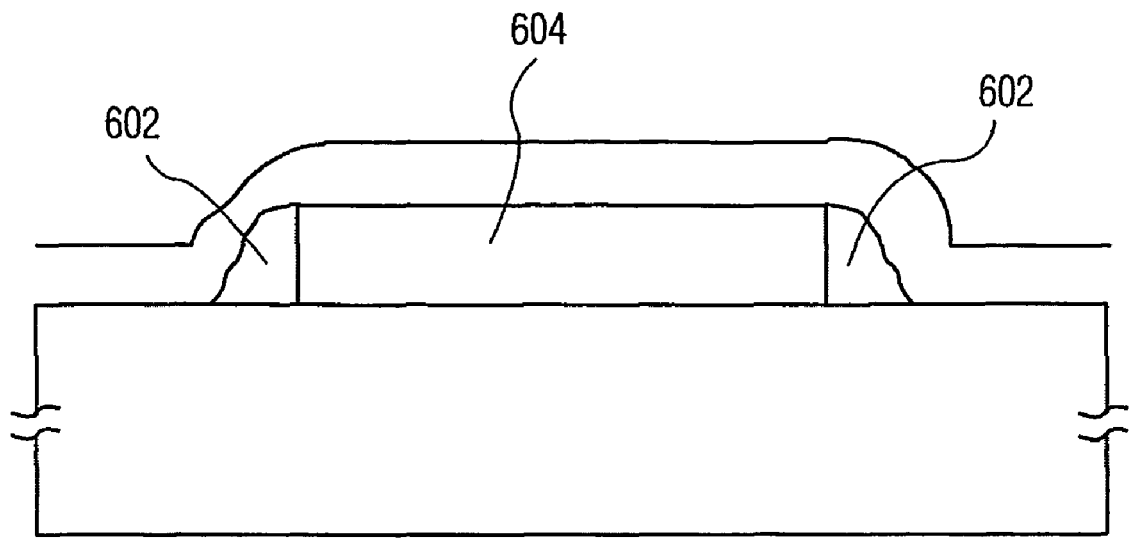
FIG. 6 is a cross-sectional view of a portion of the integrated circuit taken across line B-B showing a passivation block formed by an anisotropic etch of the first passivation layer, followed by formation of sidewall spacer structures along opposing sidewalls thereof.
Figure 7:
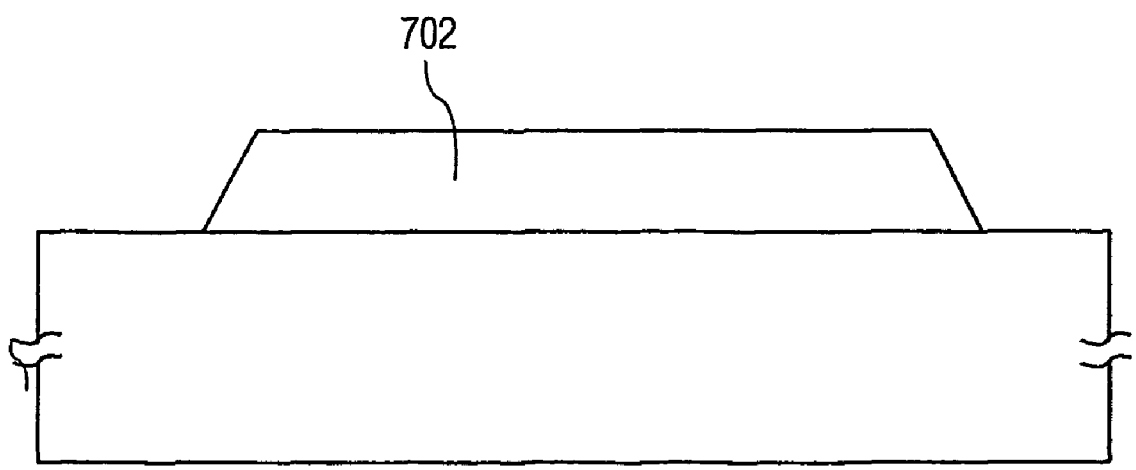
FIG. 7 is a cross-sectional view of a portion of the integrated circuit taken across line B-B showing a passivation block formed by an isotropic/sloped etch of the first passivation layer and having sidewalls formed adjacent to the passivation block.
Figure 8:
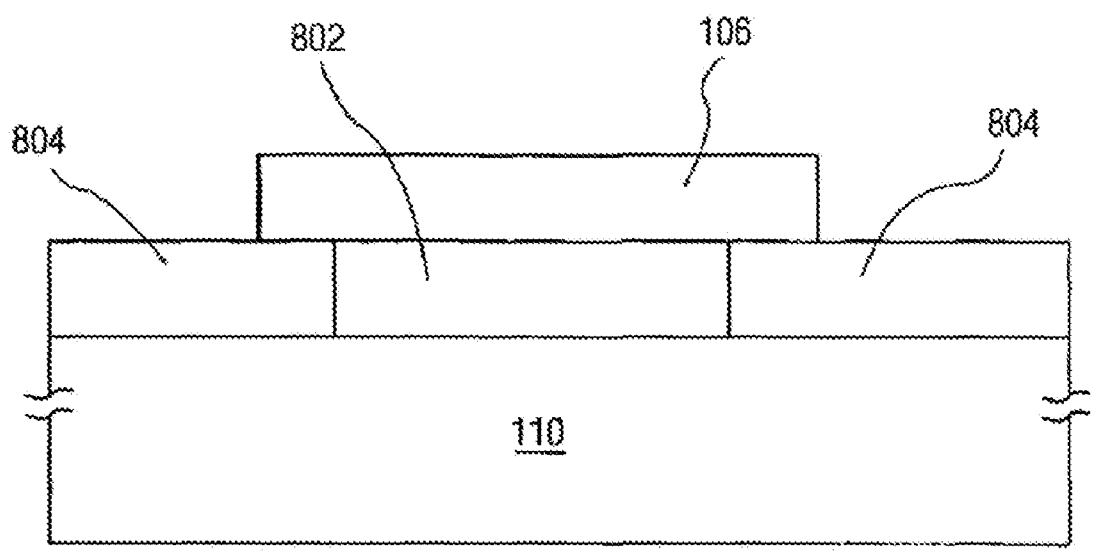
FIG. 8 is a cross-sectional view of a portion of the integrated circuit taken across line B-B showing a passivation block recessed into a surrounding ILD material.

In this illustrative embodiment, the first passivation layer is then patterned 506 so as to form at least one region. Typically, at least one region of the patterned passivation material is rectangular in shape, but the invention is not limited to any particular shape. This patterned portion of the first passivation layer may alternatively be referred to as a lower passivation block. As will be appreciated by those skilled in this field and having the benefit of the present disclosure, the thickness of the first passivation layer may be determined for any particular manufacturing process based on the particular material and manner used to form the passivation layer, and the desired degree of protection from environmental contaminants. Another possible consideration that may limit the upper bounds of thickness for the first passivation layer is the impact that this thickness has on step coverage when the overlying layer of conductors are formed. Alternatively, although with additional process complexity, the impact of the step heights of the patterned first passivation layer may be lessened by fabrication of sloped sidewalls adjacent to the lower passivation block (similar to the well known processes for forming sidewall spacers adjacent to MOSFET gate electrodes; or by recessing the lower passivation block into the ILD layer. Recessing may be achieved by any suitable process means, such as but not limited to, etching a trench in the ILD and backfilling with passivation material; or by forming the patterned passivation layer, depositing a layer of ILD material over the patterned passivation layer, and then planarizing to expose the patterned passivation layer. Planarizing may be achieved by any suitable method including, but not limited to, chemical mechanical polishing (CMP). FIGS. 6-8, show various embodiments of the present invention in which the step height of the lower passivation block is reduced. More particularly, FIG. 6 shows an embodiment in which sidewall spacers 602 are formed adjacent to the lower passivation block 604; FIG. 7 shows an embodiment in which an isotropic/sloped etch is performed on the first passivation layer in order to produce a passivation block 702 having sloped walls (any suitable processing technique that produces substantially sloped sidewalls may be used in accordance with the present invention); and FIG. 8 shows an embodiment in which the lower passivation block 802 is recessed into an ILD layer 804, thereby providing a planarized surface upon which the fuse structure 106 is formed. In other words, the surface of the ILD and the surface of the passivation block are substantially coplanar. The process flow with the least complexity for reducing the step height of the lower passivation block is sloped, or isotropic etching. However, the process flow most compatible with advanced lithography is that which produces a planarized surface.

Figure 9:
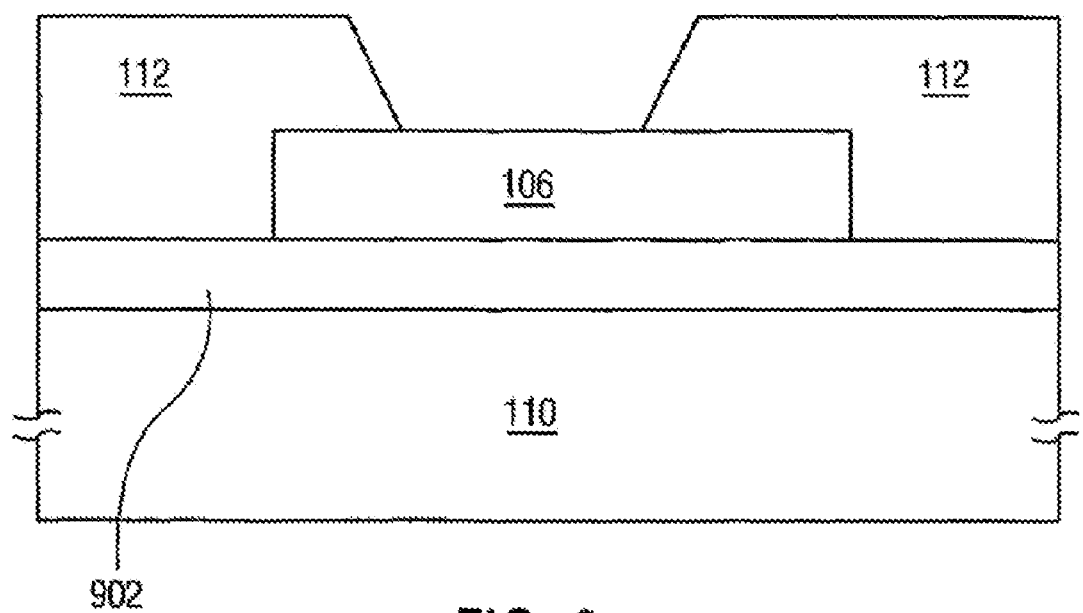
FIG. 9 is a cross-sectional view of a portion of the integrated circuit including the fuse structure, showing an embodiment in which the first passivation layer is a blanket layer disposed over an ILD layer.

Of course, as mentioned above, other embodiments may simply use a blanket, i.e., unpatterned passivation layer. FIG. 9 is a cross-sectional view of a portion of an integrated circuit including the fuse structure 106, showing an embodiment in which the first passivation layer 902 is a blanket layer disposed over an ILD layer, in this case the ILD at the top portion of substrate 110.

Subsequent to the formation of the lower passivation block, a patterned conductor having a first portion overlying a portion of the substrate and a second portion overlying a portion of the lower passivation block layer is formed 508. In one embodiment of the present invention the patterned conductor is a two layer stack with a tungsten lower layer and an aluminum, or aluminum alloy, upper layer. Any other metallurgies suitable for concurrent use as bonding pads and fuses may be used. In fact, the metals used to form the bonding pads and fuses are not required to be the same by the present invention, although the use of two different metallurgies on the same level increases process complexity, as will be appreciated by those skilled in the art and having the benefit of this disclosure. Deposition, masking, and etching of various conductors is well known in this field and is not described in greater detail herein.

The illustrative process continues by forming 510 a second passivation layer that overlies the substrate, the first passivation layer, and the patterned conductor. This second passivation layer may be of the same material as the first passivation layer but is not required to be. Typically, the second passivation layer is a silicon nitride layer formed by a PECVD operation. After formation of the second passivation layer, an opening in the second passivation layer is formed 512, the opening being fully landed by the underlying first passivation layer material Openings, or windows, in the second passivation layer may be formed by any suitable combination of masking and etching. Such masking and etching typically includes the formation of a layer of photoresist over the second passivation layer; exposing portions of the photoresist layer to a light (or other energy) source; developing the resist such that certain portions of the second passivation layer are covered by the photoresist while other portions are uncovered; and etching windows in the uncovered portions of the second passivation layer.

In some embodiments of the present invention, the fuse structure is programmed prior to the removal of the photoresist used in patterning the second passivation layer. In this way, at least some of the material thrown off by "blowing" the fuse will be deposited upon the photoresist, and subsequently the deposited material will be removed when that photoresist is removed. In other embodiments, the photoresist is removed prior to a fuse programming operation.

Various embodiments of the present invention include methods and apparatus for reducing the ingress of contaminants into the various layers, or levels, of an integrated circuit disposed below the topside passivation layer.

An advantage of some embodiments of the present invention includes a reduction in the degradation in reliability due to one or more openings in the topside passivation layer of an integrated circuit that are not fully landed on bonding pads.

It is to be understood that the present invention is not limited to the embodiments described above, but encompasses any and all embodiments within the scope of the subjoined Claims.

What is claimed is:

1. An integrated circuit, comprising:
   a substrate having a plurality of levels with a plurality of circuit elements and interconnections disposed therein;
   a first dielectric layer disposed as an uppermost layer of the substrate;
   a lower passivation block disposed on the first dielectric layer;
   a fuse structure disposed on the lower passivation block; and
   a topside passivation layer disposed over the first dielectric layer, the lower passivation block, and the fuse structure;
   wherein the topside passivation layer includes a first opening therein, and the first opening exposing at least a part of the fuse structure and at least a part of the lower passivation block.

2. The integrated circuit of claim 1, further comprising a bonding pad disposed on the first dielectric layer and further comprising a second opening in the topside passivation layer the second opening exposing the bonding pad.

3. The integrated circuit of claim 2, wherein the second opening is fully landed by the bonding pad.

4. The integrated circuit of claim 3, wherein the fuse structure and the bonding pad each comprise a metal stack.

5. The integrated circuit of claim 4, wherein the fuse structure metal stack and the bonding pad metal stack each comprise the same set of metal layers.

6. The integrated circuit of claim 1, wherein the first dielectric layer comprises an oxide of silicon; the lower passivation block comprises silicon nitride; and the topside passivation layer comprises silicon nitride.

7. The integrated circuit of claim 1, further comprising a second dielectric layer disposed on the first dielectric layer such that the second dielectric layer surrounds the at least one lower passivation block, and the second dielectric layer and the at least one lower passivation block form a planarized surface, wherein the second dielectric layer has a lower dielectric constant than the lower passivation block.

8. The integrated circuit of claim 1, wherein the at least one lower passivation block has vertical sidewalls; and further comprising sidewall spacers disposed adjacent the sidewalls of the at least one lower passivation block.

9. The integrated circuit of claim 1, wherein the at least one lower passivation block has sloping sidewalls.

10. The integrated circuit of claim 1, wherein the first opening is fully landed by the lower passivation block.

11. The integrated circuit of claim 1 further comprising a trench in the first dielectric layer, wherein the lower passivation block is disposed within the trench, and further wherein the first dielectric layer and the lower passivation block form a planarized structure.

12. A method of forming a fuse structure comprising:
providing a substrate having a plurality of levels with a plurality of circuit elements and interconnections disposed therein, the substrate having a dielectric layer disposed as the uppermost layer of the substrate;
forming a first passivation block on the first dielectric layer;
forming a conductor layer over the first passivation block;
patterning the conductor layer so as to form at least one fuse structure;
forming a second passivation layer such that the second passivation layer is disposed above the dielectric layer, the first passivation layer, and the patterned conductor layer; and
forming an opening in the second passivation layer such that at least a portion of the patterned conductor layer is exposed.

13. The method of claim 12, wherein the dielectric layer comprises an oxide of silicon; the first passivation block comprises silicon nitride; the second passivation layer comprises silicon nitride; and the conductor comprises at least one metal.

14. The method of claim 12, further comprising patterning a first passivation layer to form the first passivation block, and further comprising depositing a dielectric material over the first passivation block and over the first dielectric layer, and further comprising planarizing the dielectric material to expose the first passivation block, wherein the dielectric material forms a second dielectric layer surrounding the first passivation block.

15. The method of claim 14, wherein patterning the first passivation layer comprises anisotropically etching the first passivation layer, and further comprising forming sidewalls spacer structures adjacent to the first passivation block.

16. The method of claim 12, further comprising forming a trench in the dielectric layer prior to forming the first passivation block; and subsequent to forming the first passivation block, planarizing the first passivation block such that a surface of the dielectric layer and a surface of the first passivation layer are coplanar.

17. The method of claim 12, wherein forming an opening in the second passivation layer comprises forming a layer photoresist over the second passivation layer; exposing and developing the photoresist; and etching the second passivation layer.

18. The method of claim 17, further comprising programming the fuse and subsequently removing the photoresist.

19. The method of claim 17, further comprising removing the photoresist and subsequently programming the fuse.

20. The method of claim 17, further comprising patterning the conductor layer so as to form at least one connection terminal.

21. The method of claim 20, wherein the at least one connection terminal is a bonding pad.

* * * * *